United States Patent [19]
Gutierrez et al.

[11] Patent Number: 5,371,328
[45] Date of Patent: Dec. 6, 1994

[54] COMPONENT REWORK

[75] Inventors: Barbara L. Gutierrez; Cheng-Yuan Yu, both of Austin, Tex.

[73] Assignee: International Business Machines Corporation, Armonk, N.Y.

[21] Appl. No.: 109,562

[22] Filed: Aug. 20, 1993

[51] Int. Cl.$^5$ ............................................. H01K 1/16
[52] U.S. Cl. ..................... 174/261; 228/180.22; 174/258; 361/768; 361/767
[58] Field of Search ............... 174/250, 260, 258, 261; 361/767, 768, 750; 228/180.22, 118, 215

[56] References Cited

U.S. PATENT DOCUMENTS

| | | | |
|---|---|---|---|
| 3,597,834 | 8/1971 | Lathrop | 437/51 |
| 3,707,039 | 12/1972 | Neimirovich | 29/625 |
| 3,719,981 | 3/1973 | Steitz | 437/183 |
| 4,157,932 | 6/1979 | Hirata | 156/310 |
| 4,238,528 | 12/1980 | Angelo et al. | 427/96 |
| 4,582,556 | 4/1986 | Butt et al. | |
| 4,604,644 | 8/1986 | Beckham et al. | 257/737 |
| 5,060,844 | 10/1991 | Behun et al. | 228/180.22 |
| 5,086,558 | 2/1992 | Grube et al. | |
| 5,089,440 | 2/1992 | Christie et al. | |
| 5,121,190 | 6/1992 | Hsiao et al. | |
| 5,147,084 | 9/1992 | Behun et al. | 228/56.3 |
| 5,329,423 | 7/1994 | Scholz | 361/760 |

OTHER PUBLICATIONS

IBM TDB, "Semiconductor DIE Encapsulant with Intrinsic Release Layer", vol. 34, No. 2, Jul. 1991, pp. 181–182.

Primary Examiner—Leo P. Picard
Assistant Examiner—L. Thomas
Attorney, Agent, or Firm—Mark E. McBurney

[57] ABSTRACT

An easily reworkable circuit module is provided that allows unusable electronic components that have been encapsulated to be removed from a printed circuit board. A chip or MCM attached to a carrier using direct chip attach methods (DCA), such as C4 or SBC techniques that leave a space between the chip/MCM and carrier, due to the height of the solder balls, connection pads and the like. The present invention places a non-stick release coating on all surfaces intermediate of the chip and carrier. That is, the release coating of the present invention is placed by spraying, or the like between the chip and carrier to form a thin liquid film which inhibits the adhesion of a subsequently applied and cured rigid polymer encapsulant. Thus, when a chip or MCM tests as "bad", rework is a relatively simple matter. The solder connections between the chip and carrier of the module are reflowed and the chip is lifted off. The solder reflow temperature will be below the melting point of the encapsulant, and since the encapsulant did not stick to the chip or carrier, it can be merely wiped away with a dry cloth.

17 Claims, 3 Drawing Sheets

COMPONENT REWORK

BACKGROUND OF THE INVENTION

1. Field of the Invention

The present invention provides an economical and efficient method of reworking printed circuit boards (PCB) having either individual semiconductor devices (chips or ICs) or modules, including single chip or multichip, soldered thereon. More specifically, a non-stick or reworkable coating is applied intermediate the chip and PCB such that encapsulant surrounding the chip is unable to adhere to the PCB and can be removed subsequent to reflow of the solder.

2. Description of Related Art

Encapsulation of chips and multichip modules using a polymer type material is currently known in the art. One reason for encapsulating integrated circuit devices is to seal the input/output points of the chips from external contaminants. Additionally, a rigid polymer material will provide support to the chip or module relative to the substrate, or PWB that is the carrier. Generally, chips and MCMs have a different coefficient of thermal expansion when compared to the carrier on which they are affixed. Therefore, these materials will not exhibit the same characteristics when they are heated to operating temperatures inside a computer system. Thus, mismatch in the thermal coefficient of expansion (TCE) normally exists between chips and/or MCMs and the carrier substrate on which they are placed. This inconsistent TCE means that the chip and/or MCM will expand at a different rate per degree increase in temperature than the carrier, thereby causing stress on the I/Os connecting the chips and carrier. Conventional solutions to this problem include placing an encapsulant material between the chip and/or carrier which mechanically bonds the chip to the carrier, which relieves some of the stress caused by the expansion.

Those skilled in the art will understand that a substantial number of chips, MCMs, and other electronic components that are placed on substrate carriers for use in computer systems, or the like, do not pass the test phase of manufacturing. In these cases the chips must be removed from the carrier and replaced with other ICs that were tested as good. This replacement is commonly referred to as "rework" wherein the bad chips are replaced with good ones and the system is tested again. It is cost effective and efficient, from a manufacturing standpoint, to test the chips and/or MCMs prior to their encapsulation to avoid rework whenever possible, since it is a costly and time consuming process. However, even with testing a substantial number of components must still be reworked. Therefore, minimizing the amount of time and effort required to rework a carrier is a serious consideration to the computer industry.

Conventional systems place a single material intermediate of the chip and carrier. For example, U.S. Pat. No. 5,086,558 places an interposer between a chip and substrate, and uses relatively weak adhesive to bond the interposer to the substrate and a stronger adhesive to bond to the chip. The interposer is a thermoplastic material and will remain adhered to the chip when reworked, due to the weak adhesive used to bond it to the IBM Technical Disclosure Bulletin, volume 34, No. 2, July 1991, pages 181–182 describes a chip that is wirebonded to a carrier and encapsulated to eliminate wire breakage. To assist rework, a release layer is provided between the circuit board and the epoxy encapsulant. This release layer is not placed intermediate the chip and board.

U.S. Pat. No. 4,604,644 shows a chip connection scheme wherein an organic material is disposed between and bonded to the chip and substrate. This bonded material is used to reduce stresses exerted on the module, due to mismatched thermal coefficients of expansion. Additionally, the material is only required to be placed underneath a portion of the periphery of the chip, and is not placed near the center of the chip/substrate interface.

U.S. Pat. Nos. 5,089,440 and 5,121,190 each describe a material that is placed between a chip and substrate to reduce thermal mismatch.

U.S. Pat. No. 4,582,556 discusses encapsulation of a copper, or copper alloy lead frame. A mold release agent is included in the encapsulant material which allows the hardened encapsulant material to release from a mold which is forming the lead frame.

It can be seen that none of the prior art shows a material that allows fast and efficient rework of modules having encapsulant material intermediate the chip and substrate. Therefore, it is desirable to have a system and method that will allow cost effective and efficient rework of multichip modules.

SUMMARY OF THE INVENTION

In contrast to the prior art, the present invention provides a system and method that allow a chip, or MCM to be easily and quickly removed from a carrier without having to remove the encapsulant from the carrier.

Broadly, a chip or MCM is attached to a carrier using direct chip attach methods, such as controlled collapse chip connect (C4), solder ball connect (SBC), or C4X (miniature SBC modules) techniques. These methods leave a space between the chip/MCM and carrier, due to the height of the solder balls, connection pads and the like. Normally, this space is filled with a material that will bond to both the chip and carrier to provide TCE mismatch stress relief. However, the present invention places a non-stick release coating on all surfaces intermediate of the chip and carrier. That is, the release coating of the present invention is placed by spraying, or the like between the chip and carrier to form a thin liquid or polymer film which inhibits the adhesion of a subsequently applied and cured rigid polymer encapsulant. Thus, when a chip or MCM tests as "bad", rework is a relatively simple matter. The solder connections between the chip and carrier of the module are reflowed and the chip is lifted off. The solder reflow temperature will be below the melting point of the encapsulant, and since the encapsulant did not stick to the chip or carrier, it can be merely wiped away with a dry cloth, or the like.

Therefore, in accordance with the previous summary, object, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
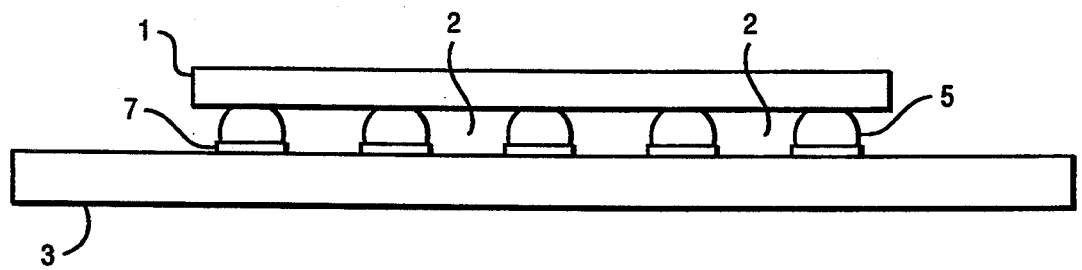
FIG. 1 is an elevational view of a semiconductor device having a plurality of solder ball disposed on a printed circuit board.

Referring to FIG. 1, an example of a typical circuit module which can utilize the present invention is shown. An integrated circuit device 1 is shown having solder balls 5 thereon which allow electrical interconnection of the IC device to a carrier substrate substrate 3. Carrier 3 may be constructed of a FR4 glass epoxy type material having circuitized electrical lines formed therein, as is well known in the art. It should be understood that the present invention also contemplates use of a multichip module with a plurality of chips disposed on an interposer substrate that is being affixed to a carrier in a computer system. Therefore, the present invention as described herein is not limited to use in attaching only chips to a carrier, but will also be deemed to include electronic component affixed to a carrier using DCA techniques. Returning to FIG. 1, interconnecting pads 7 are shown on the surface of carrier that is facing chip 1. These pads 7 are composed of tin/lead solder and placed at I/O points on the carrier in a pattern corresponding to solder balls 5 in order to provide an electrical connection between the chip and carrier I/Os. In a preferred embodiment of the present invention the chips will use the C4 technology, discussed previously, to fabricate the chip 1 with solder balls 5 thereon.

Figure 2:
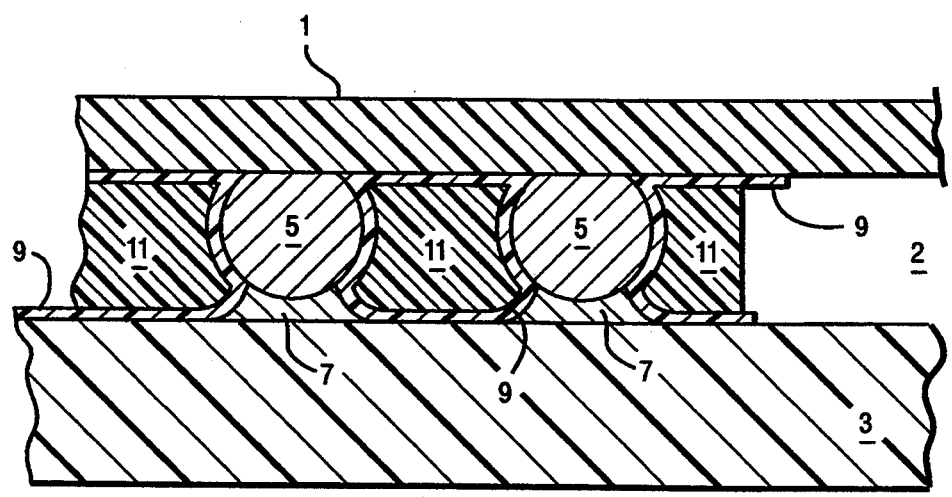
FIG. 2 is cross sectional view of a chip, or multichip module (MCM) having C4 I/O connection points attached to a PCB and having the non-stick or thermoplastic coating applied thereto in accordance with the present invention.

FIG. 2 shows the structure of FIG. 1 utilizing the encapsulation system of the present invention. Chip 1 is shown with solder balls 5 extending therefrom. It can be seen that interconnection solder pads 7 have been reflowed and contact solder balls 5. In this example, the solder composition of pads 7 has a lower melting point than solder balls 5, which have remained essentially intact. Those skilled in the art will understand that solder compositions have good wetting qualities and the reflowed solder of pads 7 will adequately bond to solder balls 5.

Once again referring to FIG. 1, it can be seen that a cavity 2 is present between the underside of the chip 1, the exterior of solder balls 5 and the top side of carrier 3. This is true, even after pads 7 have been reflowed. Thus, the only physical contact made between chip 1 and carrier 3 is through the solder balls 5 and reflowed pad 7. The remaining area intermediate the chip and carrier is empty space, which prior art systems fill with an encapsulant material consisting of epoxy, polymer, or the like, which bonds to both the chip and carrier. However, the present invention includes a non-stick coating 9 which completely covers the exposed areas of the underside of chip 1, exterior of solder balls 5, exterior of reflowed pads 7 and top side of carrier 3. That is, the non-stick coating 9 is placed such that it is the only material that will contact the encapsulant material 11. Therefore, a non-stick barrier is placed intermediate the encapsulant 11 and the chip 1, carrier 3 and I/O interconnections 5 and 7, which will drastically improve the efficiency of reworking operations required during computer system manufacturing.

It should be noted that with non-stick coating 9, encapsulant 11 will not bond, or adhere, to the underside of chip 1 or the top side of carrier 3. Conventional systems require this bonding, due to the conventional belief that the TCE mismatch requires this type of vertical support of the chip/carrier assembly. However, extensive testing has shown that only horizontal support is needed in order to adequately support the chip/carrier (or MCM/carrier) assembly (or module) due to TCE mismatches. And, this horizontal support is provided by the tension of the encapsulant material itself, without any need for the encapsulant to be bonded to the chip and/or carrier. Therefore, the non-stick coating 9 of the present invention allows the encapsulant 11 to provide good TCE mismatch support to the chip/carrier I/O interface, while not bonding to the chip/carrier surfaces, such that rework capability of module.

Figure 3:
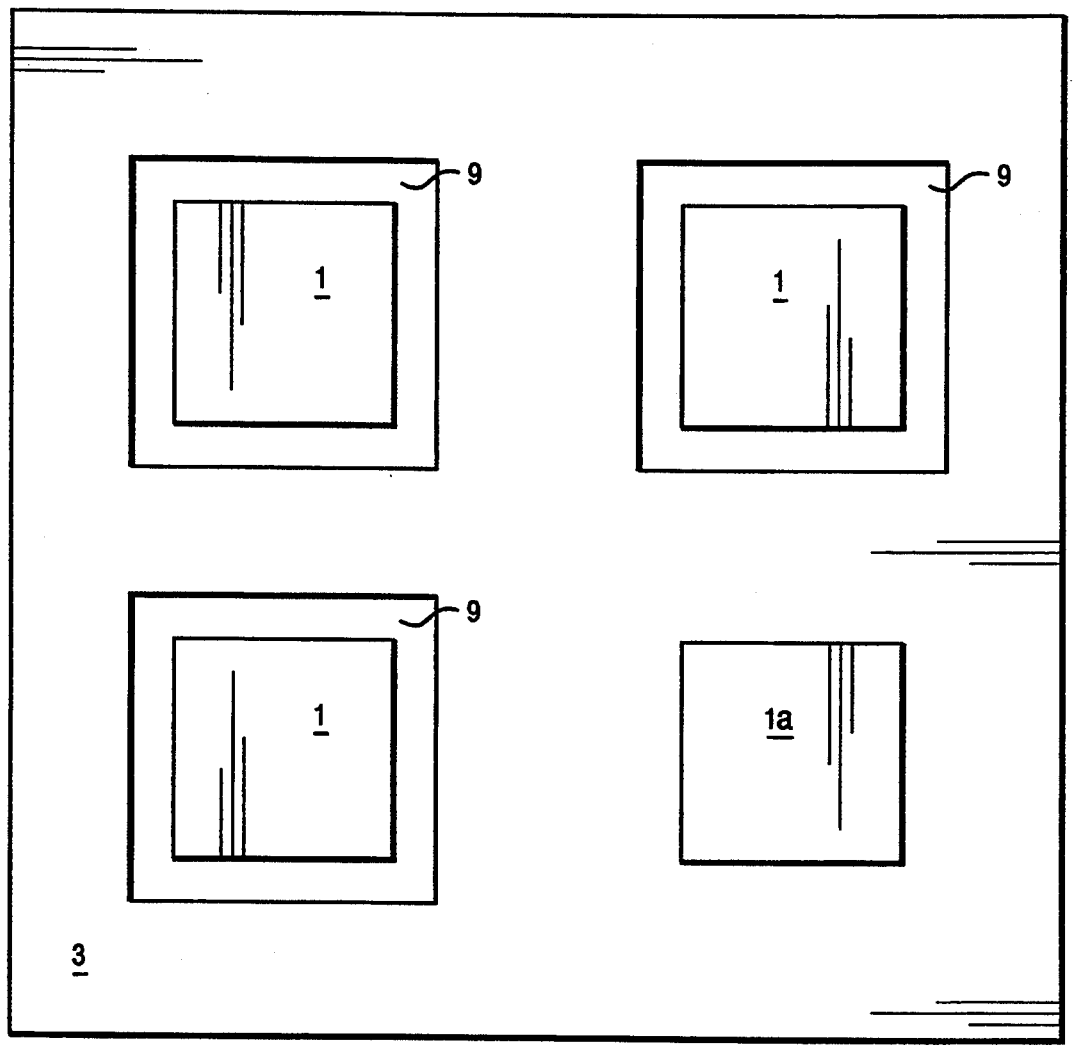
FIG. 3 is a plan view of a PCB having multiple chips or MCMs attached and showing the non-stick coating of the present invention extending around their periphery.

FIG. 3 is a plan view of a carrier 3 having a plurality of chips 1 and 1a disposed thereon. It can be seen that, in this example, three chips 1 are present which use the non-stick coating 9 of the present invention, which is placed intermediate the chips 1 and carrier 3 and extends outwardly on the carrier 3 a substantial distance past the periphery of chip 1. A chip 1a is also shown which may not utilize the present invention, such as a standard pin through hole type chip where there is no space intermediate the chip and carrier surfaces. Chip 1a is shown in order to demonstrate that the present invention is capable of being used on modules having chips with differently configured I/Os and is not limited to only those modules having all DCA type chips. Those skilled in the art will understand that other pin through hole configurations are known which have space intermediate the chip and carrier and are capable of using the encapsulation and rework method of the present invention.

Figure 4:
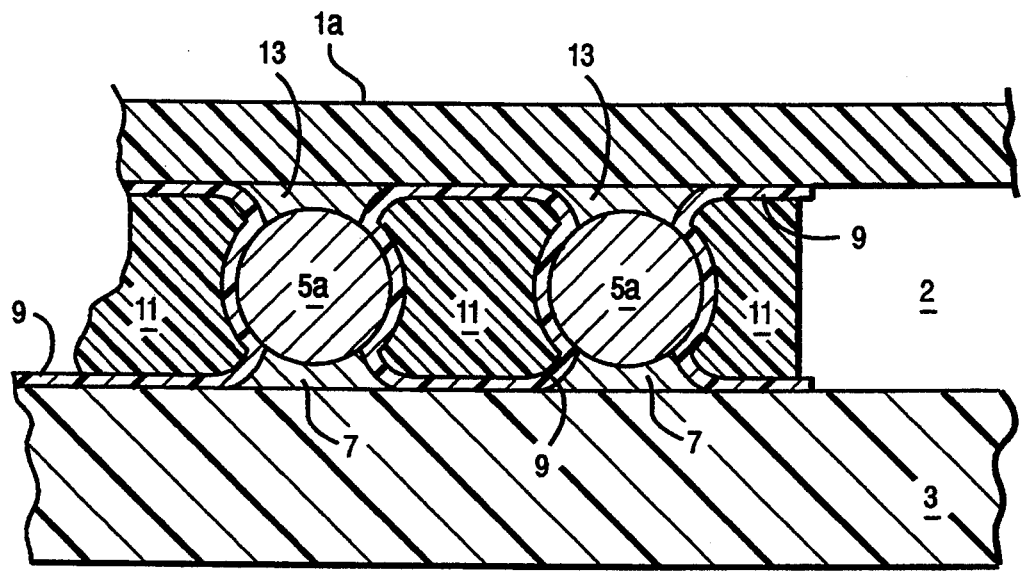
FIG. 4 is another cross sectional view of a connection scheme common for multilayer ceramic (MLC) modules wherein solder ball connection (SBC) is used intermediate distinct connection pads on the MLC and PCB.

FIG. 4 is a cross sectional elevation view similar to FIG. 2, but showing a solder ball interconnection scheme. SBC techniques are very similar to the previously described C4 structure, however, the solder balls 5a are generally larger in diameter that the C4 solder balls 5. Also, an interposer 1a is used which has I/O interconnection pads 13 consisting of a tin/lead solder composition which will reflow at the same time as the I/O pads 7 disposed on carrier 3. Thus, the cavity 2 will be formed by the underside of interposer 1a, the exterior of reflowed I/O pads 13 and 7, and the exterior of solder balls 5a. Although the structure is slightly different, the present invention will operate in the same manner regardless of whether a C4 or an SBC interconnection scheme is used, and whether a chip 1 or interposer 1a (in a MCM) is being affixed to the carrier 3. That is, the non-stick coating 9 is placed on the exposed surface which forms cavity 2, such that the encapsulant 11 will only contact non-stick 9 and not bond to interposer 1a nor carrier 3. This structure will provide the necessary horizontal support, to compensate for any TCE mismatch between interposer 1a and carrier 3.

Figure 5:
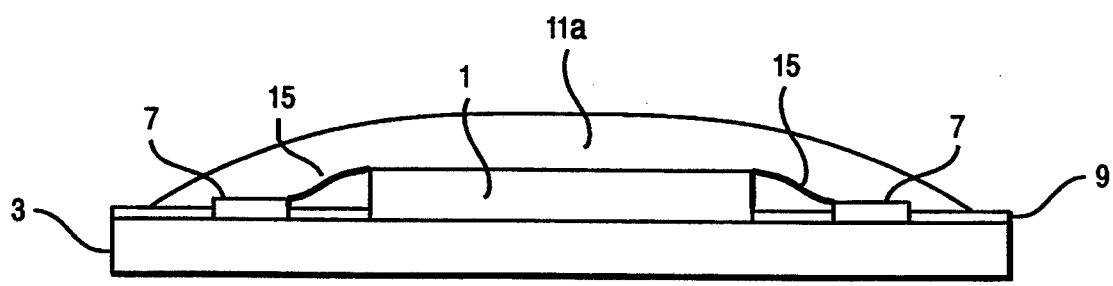
FIG. 5 is a side elevation of a "glob top" type structure capable of using the non-stick coating of the present invention.

Thus, it can be seen that different configurations of chip/carrier interconnections can utilize the present invention. Additionally, FIG. 5 shows another structure contemplated for use with the present invention. Carrier 3 is shown, again including I/O pads 7. In this module, a chip 1 having leads 15, which correspond to I/O pads 7 (and are soldered thereto), is disposed on a carrier 3. This DCA structure may be a tape automated bonding technique, wherein the chips 1 are provided on a tape, which is distributed on reels. The tape is unwound from the reels such that the chips are adjacent corresponding receiving carriers and attached thereto. The temperature of the assembly is then elevated to reflow the I/O pads 7 and, subsequent to cooling, the non-stick coating 9 is then sprayed on the module. Finally, the encapsulant 11a is placed over the chip 1 by spraying, coating, or the like. It can be seen that the encapsulant 11a will contact the surface of the chip 1 and the non-stick coating on carrier 3. Thus, if chip 1 needs to be removed, then the solder in pads 7 is reflowed and the chip (with encapsulant) is lifted away. Other structures, such a leadless ceramic chip carrier (LCCC) and thin small outline package (TSOP) are also capable of being used with non-stick coating and are contemplated by the present invention.

An example of the present invention will now be described wherein a liquid non-stick material 9 is applied to the underside of chip 1, top side of carrier 3 and the exterior surfaces of solder balls 5 and reflowed pads 7. Initially, a chip is affixed to a carrier as shown in FIG. 2, with the interconnection pads 7 reflowed to interconnect with solder balls 5. The liquid non-stick coating 9 is then dispensed underneath the chip 1 into cavity 2 by spraying, or the like. This thin liquid non-stick coating 9 forms a film which inhibits the adhesion of the subsequently applied and cured rigid polymer encapsulant 11. However, it should be noted that the non-stick coating 9 in no way inhibits the flow of the polymer encapsulant 11 between the chip and carrier during its application. In a first preferred embodiment, the non-stick liquid coating 9 may be a George Mann Release Agent 2300, as well as silicone fluids, perfluorinated liquids, or other low surface energy liquids capable of forming a thin, uniform, pinhole free non-stick coating. Low surface energy indicates that the non-stick coating will have poor adhesion characteristics with the carrier or chip surfaces, while a uniform, pinhole free coating prevents the subsequently applied encapsulant from bonding with the chip or carrier surfaces through the pinholes. Suitable encapsulant materials include any low coefficient of thermal expansion, high modulus encapsulant which cures at a temperature well below the boiling point of the non-stick coating. Preferred encapsulant materials include Hysol 542-5, and other suitable polymer materials.

An example of the enhanced rework capabilities of modules using the present invention will now be described.

Subsequent to attachment of the chip 1 to carrier the liquid non-stick coating 9 is sprayed around all four sides of the chip/carrier interface. The non-stick coating material should extend approximately ½ inch around all sides of the module as shown in FIG. 3. Thus, the underside of chip 1, the top side of carrier 3 and the exterior surfaces of the solder balls 5 and pads 7 are covered with non-stick coating 9. Next, the module must sit for a minimum of 12 hours at room temperature to allow for any solvents present on the carrier 3 to evaporate. The encapsulant 11 is then dispensed between the chip and carrier into cavity 2 using a standard process which includes preheating the module to 90 degrees C. and dispensing the encapsulant over a 3-4 minute period on three sides of the module, allowing the encapsulant to wick throughout cavity 2. The encapsulant is then cured for 2 hours at 100 degrees C. in a convection oven.

Electrical testing may then performed on the module, and it is determined if the module is acceptable for use in a computer system, other electronic device. If the chip (or MCM) tests "good" then the carrier is placed in an adapter slot, or the like in the computer system. However, if the chip tests "bad" then the module must be reworked. In this case, the module having the encapsulated chip/carrier assembly with non-stick coating is placed on a hot plate, or other suitable heating device and the temperature is raised to a point that will reflow the solder composition of pads 7. For example, a solder composition of 63% tin and 37% lead will have a rework temperature of approximately 230 degrees C. It will normally take from 30 seconds to 1 ½ minutes for the solder to reflow. Once the solder does reflow, the chip, or MCM as the case may be is grasped and twisted gently and the chip will then slide off the I/O pads on the carrier when it is lifted away. Of course, tools such as a spatula type device may be used to provide leverage to aid in releasing the chip and other tools may be used to provide easier grasping, twisting and lifting of the chip. Once the bad chip is removed, the carrier is allowed to cool to room temperature. The solder slivers can be wiped off with a dry cloth or swab. No solvent is needed.

It should be noted that this process is applicable to any solder alloy used to join a chip or module to a carrier, so long as the non-stick coating material boils above the solder reflow temperatures. In this manner a module can be easily reworked, thus saving great amounts of time and effort, since no extensive cleaning of the encapsulant material from the carrier is required.

Of course, additional types of materials can be used to provide the non-stick coating of the present invention. It is important with today's environmental concerns to use materials that are as safe and non-toxic as possible. Thus, aqueous, or water based materials are preferred for use. Through testing it was determined that several water based materials for the non-stick coating 9 could be used without any noticeable degradation in performance. The other preferred materials include aqueous emulsions of polysiloxanes/silicones, such as George Mann Aqualease 6101, aqueous emulsions of poly tetrafluroethyene, and aqueous emulsions of polyvinylidene fluoride. These materials belong to a general class of water based, non-toxic nonflammable, low viscosity liquids which can deposit a non-conductive, non-corrosive, non-stick barrier layer on the carrier and chip (or MCM). Aqueous coatings are not necessarily low surface energy, although the films they deposit often are. Extensive testing provided analytical data, experimental data to show that adequate support was given to the modules to compensate for any TCE mismatches, and 16 modules were successfully removed using a 10% Aqualease 6101 solution in distilled water (out of 16 attempts) with no damage to the carrier's solder mask supports, thus showing the viability of this water based class of materials. It was also determined that concentrations of release agent as low as 3% will provide adequate release characteristics.

The process for applying water based non-stick materials is similar to that described above. The aqueous non-stick coating is applied by spraying, dipping, brushing or the like, and the water is removed by 10 minutes of heating is a box, or infrared oven at 100 degrees C. The encapsulant application and rework are the same as described above.

Another preferred embodiment of the present invention includes the use of a thermoplastic material as the non-stick coating. In some cases greater mechanical protection is required for the chip/carrier solder connections. A solution of thermoplastic polymer having a softening point below the melting point of the solder alloy used in pads 7 can then be used to assemble the chip/MCM to the carrier. The thermoplastic material is dispensed by spraying, or the like along one edge of the module and allowed to wick underneath. The amount of solvent on the card and the concentration of the thermoplastic material is controlled so that after solvent evaporation, a thin pinhole free film remains on the underside of chip 1, the top side of carrier 3 and the exterior of solder balls 5 and pads 7. This film inhibits the adhesion of the encapsulant to the carrier, however, the thermoplastic film adheres to the module, and the encapsulant adheres to the thermoplastic film, thus providing greater mechanical protection for the encapsulated solder joints. The thermoplastic material does not interfere with the wicking of the encapsulant material into cavity 2 (FIG. 2). After placement the encapsulant is the cured below the softening point of the thermoplastic layer. In a preferred embodiment, the thermoplastic material included Humiseal 1B73, available from the Case Corp. It is critical that the softening point of the thermoplastic layer be below the solder reflow temperature, otherwise, the chip/MCM could not be removed from the carrier at the solder reflow temperature, which is the desired minimum temperature to be used for rework. Of course other suitable materials such as acrylics, polymers, and the like, having good moisture resistance and film forming properties, with softening points below the melting point of solder are also contemplated for use by the present invention.

A description of the preferred embodiment using thermoplastic will now be described. An acrylic solution is applied across one edge of the module (which has been assembled using DCA techniques as described above) and let the solution wick underneath the chip/MCM for approximately 10-20 seconds. An acrylic solution of 29.5% Humiseal 1B73 and 70.5% propylene carbonate was used and found to give good results. The propylene carbonate is added to the solution to act as a thinner to reduce the solids content. Humiseal 1B73 without thinner does coat the carrier and chip/MCM, but forms a dense film that does not allow the encapsulant to penetrated and fill between 100% of the solder joints (balls 5 and pads 7, FIG. 2), which is critical. The thinned thermoplastic material has a solids content of approximately 7%. The thinner also aids formation of a pinhole free film by slowing evaporation during drying.

The module with the thermoplastic film is then dried in a convection oven at 100 degrees C. for approximately 2 ½ hours. The card is then preheated to approximately 90-100 degrees C. and the encapsulant, i.e. epoxy, polymer, or other rigid encapsulant is applied, using a dispense needle, in a continuous band, and allowed to wick between the chip/MCM and carrier on 3 sides. When encapsulant flows out of the fourth side, the module is 100% filled. The encapsulated module is then cured based on the type of encapsulant material used. For Hysol 542-5, curing requires 2 hours at 100 degrees C.

To rework a module, which tests "bad", having a thermoplastic non-stick film, the module is heated to 30-40 degrees C. above the reflow temperature of the solder used to form the interconnection between the chip/MCM and carrier. In this example 63% tin and 37% lead solder was used and the module was heated to 220 degrees C., on a hotplate. Of course, any other suitable heating device could be substituted for the hotplate. At this temperature, the solder interconnects are reflowed and in a molten state, and the thermoplastic film is soft and pliable. The chip/MCM is grasped and gently rotated to loosen it, and then lifted away from the carrier. Subsequent to removal of the chip/MCM, the carrier is cooled, and then solvent, such as chlorine, or the like, is used to remove remnants of the thermoplastic layer. The carrier is now ready for site redress and the attachment of a new chip, or MCM as the case may be.

Thus, it can be seen that most modules can utilize a non-stick coating wherein the encapsulant adheres to the coating, not the components and chip/MCMs can be cleanly removed from the module, requiring only a wipe off of the carrier with a dry cloth. In cases where greater mechanical support is required, a thermoplastic non-stick film can be used, which requires the use of a solvent to remove the thermoplastic residue from the carrier. The tradeoff being, adequate support and easier rework, or additional mechanical support and somewhat more difficult rework.

Although certain preferred embodiments have been shown and described, it should be understood that many changes or modifications may be made therein without departing from the scope of the appended claims.

We claim:

1. An assembly including a carrier with least one electronic component affixed thereto, comprising:
   means for electrically connecting said component with said carrier;
   encapsulation means for supporting said electrical connection means; and
   means for preventing said encapsulation means from adhering to any of said carrier, said electrical connection means and said component.

2. An assembly according to claim 1 wherein said means for preventing are disposed intermediate said carrier and said component.

3. An assembly according to claim 2 wherein said encapsulation means are disposed intermediate said carrier and said component and contacts only said means for preventing.

4. An assembly according to claim 3 wherein said component is one of an integrated circuit device and a multichip module.

5. An assembly according to claim 4 wherein said carrier is a printed wire board.

6. An assembly according to claim 5 wherein said encapsulation means includes means for excluding environmental contaminants.

7. An assembly according to claim 5 wherein said means for preventing are comprised of a non-stick coating material.

8. An assembly according to claim 5 wherein said non-stick coating material is comprised of a silicone or perfluorinated liquid material.

9. An assembly according to claim 5 wherein said non-stick coating is comprised of a water soluble material.

10. An assembly according to claim 5 wherein said non-stick coating is comprised of a thermoplastic material.

11. An assembly according to claim 5 wherein said electrical connection means include solder balls disposed on said component, and electrical connection pads disposed on said carrier.

12. An assembly according to claim 1 wherein said means for preventing is disposed on a surface of said carrier, intermediate said component and said carrier and extending outwardly around the periphery of said component.

13. An assembly according to claim 12 wherein said encapsulation means is disposed to encompass said component and to contact said means for preventing.

14. An assembly according to claim 13 wherein said component is an integrated circuit device and said carrier is a flexible substrate.

15. An assembly according to claim 14 wherein said means for preventing is a non-stick material.

16. An assembly according to claim 15 wherein said non-stick material is comprised of a silicone or perfluorinated liquid material.

17. An assembly according to claim 16 wherein said non-stick material is comprised of a water soluble material.

* * * * *